United States Patent
Doan

(10) Patent No.: US 6,174,821 B1
(45) Date of Patent: *Jan. 16, 2001

(54) SEMICONDUCTOR PROCESSING METHOD OF DEPOSITING POLYSILICON

(75) Inventor: Trung Tri Doan, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/868,057

(22) Filed: Jun. 3, 1997

Related U.S. Application Data

(62) Division of application No. 08/646,719, filed on May 9, 1996.

(51) Int. Cl.[7] ................................. H01L 21/469
(52) U.S. Cl. .................. 438/763; 438/386; 438/657
(58) Field of Search ......................... 438/239, 240, 438/253, 238, 396, 488, 763, 386, 657

(56) References Cited

U.S. PATENT DOCUMENTS

| | | | |
|---|---|---|---|
| 5,026,574 | * 6/1991 | Economu et al. | 438/488 |
| 5,032,545 | 7/1991 | Doan et al. | 437/242 |
| 5,258,333 | 11/1993 | Shappir et al. | 437/235 |
| 5,378,645 | 1/1995 | Inoue et al. | 437/47 |
| 5,382,533 | 1/1995 | Ahmad et al. | 437/24 |
| 5,436,481 | 7/1995 | Egawa et al. | 257/324 |
| 5,445,999 | 8/1995 | Thakur et al. | 437/241 |
| 5,518,946 | 5/1996 | Kuroda | 437/241 |
| 5,612,558 | 3/1997 | Harshfield | 257/298 |
| 5,619,057 | 4/1997 | Komatsu | 257/382 |
| 5,633,036 | 5/1997 | Seebauer et al. | |
| 5,663,077 | 9/1997 | Adachi et al. | 438/151 |
| 5,719,083 | 2/1998 | Komatsu | 438/652 |
| 5,760,475 | 6/1998 | Cronin et al. | 257/758 |
| 5,834,372 | 11/1998 | Lee | 438/677 |
| 6,054,396 | * 4/2000 | Doan | 438/763 |

OTHER PUBLICATIONS

Wolf, S., "Silicon Processing For The VLSI Era", vol. 2, pp. 188–189, 194–195, 609–614 (1990).

Wolf, S., "Silicon Processing for the VLSI Era, vol. 2:Process Integration", Lattice Press, pp. 212–213, 1990.

* cited by examiner

*Primary Examiner*—Charles Bowers
*Assistant Examiner*—Jack Chen
(74) *Attorney, Agent, or Firm*—Wells, St. John, Roberts, Gregory & Matkin P.S.

(57) ABSTRACT

The invention encompasses a semiconductor processing method of depositing polysilicon. A substrate is provided. The substrate comprises a first material and a second material which join at a junction, and which are different from one another. The substrate is exposed to a $SiH_4$-comprising source gas to form a nucleation layer consisting of Si. After the exposing, a polysilicon layer is chemical vapor deposited atop the nucleation layer.

1 Claim, 3 Drawing Sheets

US 6,174,821 B1

SEMICONDUCTOR PROCESSING METHOD OF DEPOSITING POLYSILICON

RELATED PATENT DATA

This application is a divisional application of U.S. patent application Ser. No. 08/646,719, filed May 9, 1996, titled "Semiconductor Processing Method Of Reducing Thickness Depletion Of A Nitride Layer At A Junction Of Different Underlying Layers", listing the inventor as Trung Tri Doan.

TECHNICAL FIELD

This invention relates to semiconductor processing methods of reducing thickness depletion of a nitride layer at a junction of different underlying layers.

BACKGROUND OF THE INVENTION

Capacitors are common devices formed in semiconductor processing in the fabrication of integrated circuitry. Such comprise a pair of conductive plates or elements separated by an intervening capacitor dielectric layer. The plates on opposite sides of the dielectric are oppositely charged by a suitable voltage source, with the electrical energy of the charge system being stored in the polarized dielectric with capacitance being proportional to the area and dielectric constant of the dielectric layer and inversely proportional to its thickness.

One common material utilized for capacitor plates is conductively doped polysilicon. Such is utilized because of its compatibility with subsequent high temperature processing steps, good thermal expansion properties with $SiO_2$, and its ability to be conformally deposited over widely varying topography. A common dielectric layer utilized in fabrication of polysilicon capacitors is silicon nitride. An alternate material which can be used in combination with silicon nitride is silicon dioxide.

When fabricating a capacitor, a junction interface will typically be provided between the lower conductive capacitor plate and an electrically insulating layer, such as silicon dioxide, upon which the lower capacitor plate is partially formed. This lower polysilicon layer is typically patterned, and then covered by a blanket deposition of silicon nitride which serves as the capacitor dielectric layer. However, silicon nitride deposits at different rates atop polysilicon and silicon dioxide.

For example, FIG. 1 illustrates a prior art wafer construction indicated generally by reference numeral 10. Such is comprised of a silicon dioxide layer 12 having a trench opening 14 provided therein. A conductively doped layer 16 of polysilicon overlies silicon dioxide layer 12, and has been patterned to define a desired outline of a lower capacitor plate shape. A layer 18 of silicon nitride has been deposited atop capacitor plate 16 and silicon dioxide layer 12. As shown, nucleation of silicon nitride layer 18 occurs much quicker with respect to the polysilicon of layer 16 than with oxide layer 12, thus resulting in a thicker portion of layer 18 over polysilicon 16 than over silicon dioxide 12. Undesirably, this creates a very thin region, typically even thinner than that portion of nitride layer 18 over silicon dioxide 12, at location 20 where the polysilicon 16 and silicon dioxide layer 12 join. This thinner portion is highly undesirable, as a weak point is created where voltage breakdown or shorting between the capacitor plates can undesirably occur.

It would be desirable to develop processes and structures which alleviate this problem. The invention was primarily motivated out of concerns associated with capacitor formation impacted by a polysilicon and silicon dioxide interface at the edge of a lower capacitor plate. However, the artisan will appreciate utility of the invention to other aspects of semiconductor wafer processing, with the invention only being limited by the accompanying claims appropriately interpreted in accordance with the doctrine of equivalents.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of reducing thickness depletion of a nitride layer at a junction of different underlying layers comprises the following steps:

providing a substrate, the substrate comprising a first material and a second material, the first and second materials joining at a surface junction, the first and second materials being different from one another;

exposing the substrate to a nitrogen containing gas under pressure and elevated temperature conditions effective to nitridize an outer portion of both the first and second materials with the nitrogen containing gas to provide a nitrogen containing nucleation layer at the outer portion of both of the first and second materials over the surface junction; and chemical vapor depositing a nitride layer atop the nucleation layer over the first and second materials and the surface junction.

Figure 1:
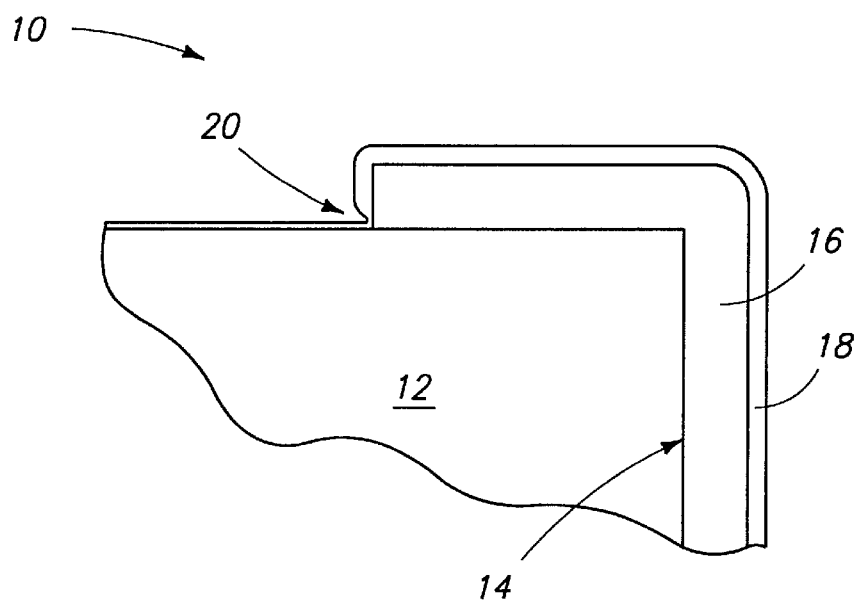
FIG. 1 is a diagrammatic sectional view of a prior art semiconductor wafer fragment, and is discussed in the "Background" section above.
Figure 2:
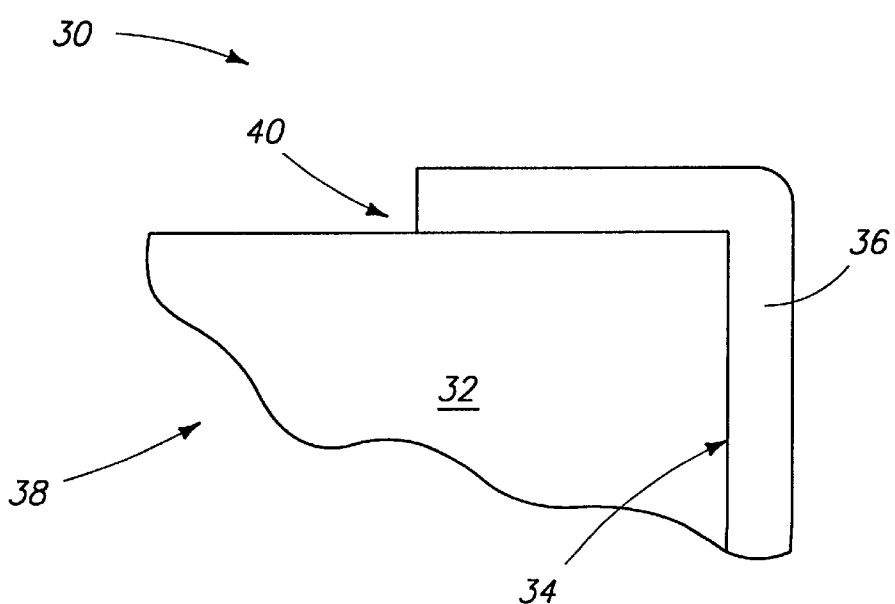
FIG. 2 is a diagrammatic sectional view of a semiconductor wafer fragment at one processing step in accordance with the invention.

Referring to FIGS. 2–5 and initially to FIG. 2, a semiconductor wafer fragment in process is indicated generally with reference numeral 30. In the preferred embodiment, the same essential construction as initially provided in connection with FIG. 1 is shown. Accordingly, such is comprised of a $SiO_2$ layer 32 having a trench or container opening 34 provided therein for formation of a capacitor. A polysilicon layer 36 has been provided and patterned as shown to define the outline of a desired shape of a first capacitor plate. In one context of the invention, layer 36 constitutes a first material while layer 32 constitutes a different second material. In combination, layers 36 and 32 comprise a substrate 38, with first material 36 and second material 32 joining or meeting at a surface junction 40. In the preferred embodiment, first material 36 is electrically conductive and second material 32 is electrically insulative.

Figure 3:
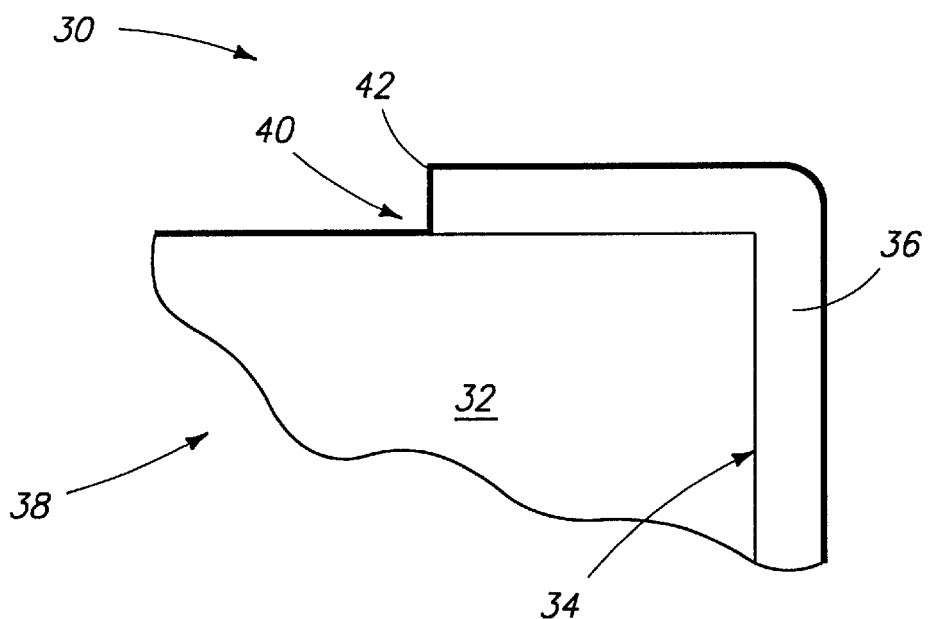
FIG. 3 is a view of the FIG. 2 wafer fragment at a processing step subsequent to that shown by FIG. 2.

Referring to FIG. 3, substrate 38 is exposed to a nitrogen containing gas under pressure and elevated temperature conditions effective to nitridize an outer portion of both the first material 36 and the second material 32. The nitridizing provides a nitrogen containing nucleation layer 42 at the outer portion of both of first material 36 and second material 32 over surface junction 40. Such exposure preferably occurs in a chemical vapor deposition reactor. Further, such processing might by way of example only occur in any controlled environment furnace, rapid thermal processor, or plasma reactor such as a high density plasma reactor or remote plasma chamber. Example and preferred nitrogen containing gases include $N_2$, $NH_3$, $NF_3$, $NO_x$ and mixtures thereof.

Layer 42 might comprise or even consist essentially of $Si_3N_4$ as-deposited. Alternately, layer 42 might effectively comprise a very thin, mono-atomic layer of nitrogen atoms projecting outwardly relative to the first and second materials. Further, the layer might be of somewhat different composition over first material 32 and second material 36, such as silicon nitride over material 36 by interaction of nitrogen atoms with silicon, and unassociated nitrogen atoms over second material 32. An example and typical thickness range for layer 42 is from about 1 Angstrom to about 100 Angstroms.

Immediately before the nitrogen exposing step, the substrate is subjected to a cleaning process to remove surface impurities from the first and second materials. Examples would include wet or dry cleaning. Preferably, the cleaning is conducted in situ in the same chamber which the nitrogen exposing step occurs. An example clean would be to expose the substrate to an HF vapor or to $H_2$ at an example temperature of 1000° C.

An example and preferred pressure range for the nitrogen exposing step is from $10^{-6}$ Torr to 760 Torr. However alternately, one could also expose to nitrogen above one atmosphere, such as at 10 to 20 atmospheres. The preferred elevated temperature is from about 200° C. to about 1200° C. An example flow rate of the nitrogen containing gas to a reactor is from about 10 sccm to about 50 slm. An example effective exposure time will depend on the temperature utilized, with higher exposure times typically being utilized for lower temperatures. An example exposure time at 1100° C. and 760 Torr at a flow rate of 20 slm of $N_2$ is expected to range anywhere from 0.1 minute to 10 minutes. Ideally, the exposing of the substrate to the nitrogen containing atmospheres effectively provides a uniform nucleation surface layer 42 over first material 36 and second material 32 for subsequent cell nitride deposition.

Figure 4:
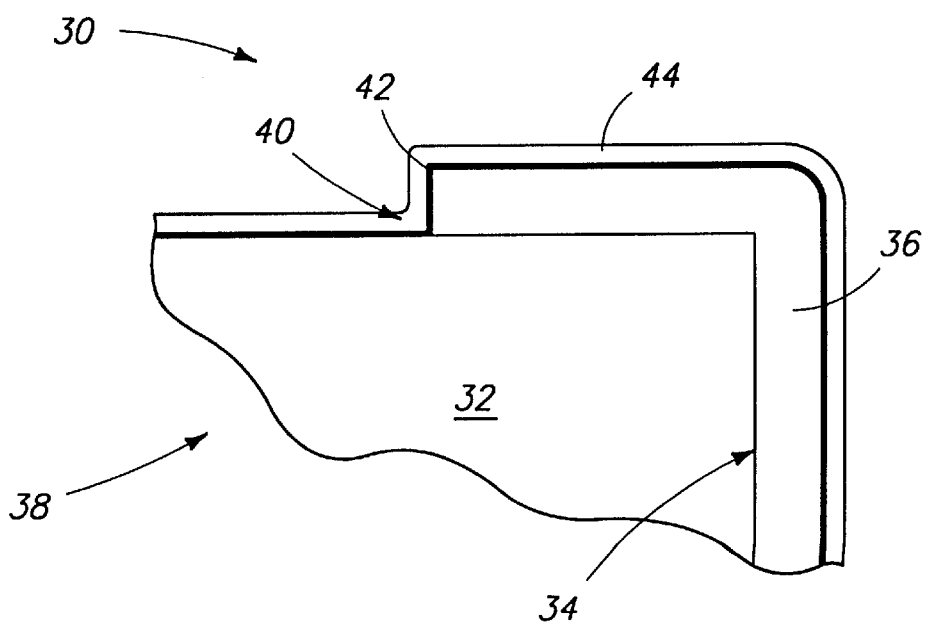
FIG. 4 is a view of the FIG. 2 wafer fragment at a processing step subsequent to that shown by FIG. 3.

Referring to FIG. 4, a nitride layer 44 is chemical vapor deposited atop nucleation layer 42 over first material 36 and second material 32 and surface junction 40. Such layer in the context of formation of a capacitor construction preferably comprises silicon nitride, with nucleation layer 42 ideally facilitating provision of layer 44 to the same thickness over first material 36 and second material 32, as shown.

Figure 5:
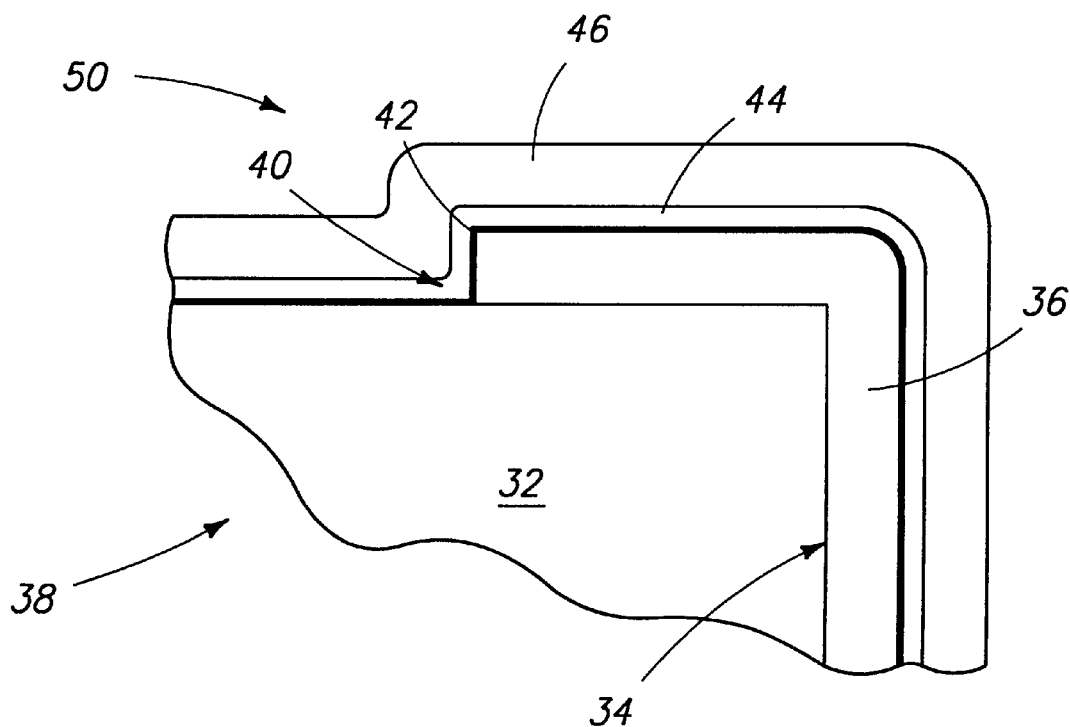
FIG. 5 is a view of the FIG. 2 wafer fragment at a processing step subsequent to that shown by FIG. 4.

Referring to FIG. 5, an electrically conductive cell plate layer 46, preferably conductively doped polysilicon, is chemical vapor deposited over cell dielectric layer 44 to substantially complete formation of a capacitor construction 50.

The invention in overcoming the prior art problems is expected to have its greatest advantageous impact where the general or global angle between first material 36 and second material 32 is extreme relative to one another, at from about 40° to about 140°, with 90° being shown in the figures. The invention also contemplates products produced by the above process.

Although the invention was principally motivated in overcoming thickness depletion problems associated with deposition of nitride layers, the invention is expected to have applicability to other materials. Specifically, the invention contemplates exposing the two material substrate to a source gas having a component common with a I component in the layer to be deposited. Such will be conducted under temperature and pressure conditions effective to provide a nucleation surface at the outer portion of both of the first and second materials over the surface junction. What follows is chemical vapor depositing of the desired layer atop the nucleation surface over the first and second materials and the surface junction, said layer comprising the common component.

In the above nitride example, the common component is nitrogen in the nitrogen containing gas and in the nitride layer. Where for example $SiO_2$ were being deposited, the source gas could be $O_2$ with O being the component common in the source gas and deposited $SiO_2$ layer. As further examples, where polysilicon were being deposited, the source gas could be $SiH_4$ with Si being the component common in the source gas and deposited polysilicon layer. Where for example $TiSi_2$ were being deposited, the source gas could be $TiCl_4$ with Ti being the component common in the source gas and deposited layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of depositing polysilicon layer over a junction of different material underlying layers, the method comprising the following steps:

providing a substrate comprising a first material and a second material, the first and second materials comprising outer portions and joining at a surface junction, the first and second materials being different from one another;

exposing the substrate to an $SiH_4$-comprising source gas to form a nucleation layer consisting of Si on the outer portions of both of the first and second materials and on the surface junction; and after the exposing, chemical vapor depositing the polysilicon layer on the nucleation layer the deposited polysilicon being over the first and second materials and the surface junction.

* * * * *

UNITED STATES PATENT AND TRADEMARK OFFICE
CERTIFICATE OF CORRECTION

PATENT NO. : 6,174,821 B1
DATED : January 16, 2001
INVENTOR(S) : Trung Tri Doan

Page 1 of 1

It is certified that error appears in the above-identified patent and that said Letters Patent is hereby corrected as shown below:

<u>Column 4,</u>
Line 13, after the second occurrence of "a", please delete "l".
Line 44, after "depositing" please add -- a --.

Signed and Sealed this

Twenty-fifth Day of September, 2001

Attest:

*Nicholas P. Godici*

NICHOLAS P. GODICI
*Attesting Officer*   *Acting Director of the United States Patent and Trademark Office*